US009397087B1

(12) United States Patent
Kull et al.

(10) Patent No.: US 9,397,087 B1
(45) Date of Patent: Jul. 19, 2016

(54) DISTRIBUTED ELECTROSTATIC DISCHARGE PROTECTION CIRCUIT WITH MAGNETICALLY COUPLED DIFFERENTIAL INPUTS AND OUTPUTS

(71) Applicant: INTERNATIONAL BUSINESS MACHINES CORPORATION, Armonk, NY (US)

(72) Inventors: Lukas Kull, Zurich (CH); Thomas E. Morf, Gross (CH); Jonas R. Weiss, Hirzel (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/967,332

(22) Filed: Dec. 13, 2015

(51) Int. Cl.
  *H02H 3/00* (2006.01)
  *H02H 9/02* (2006.01)
  *H01L 27/02* (2006.01)
  *H01L 23/66* (2006.01)

(52) U.S. Cl.
  CPC ............ *H01L 27/0262* (2013.01); *H01L 23/66* (2013.01); *H01L 2223/6672* (2013.01)

(58) Field of Classification Search
  CPC .................. H01L 2924/0002; H01L 2924/00; H02H 3/20; H02H 9/046
  USPC .......................................................... 361/56
  See application file for complete search history.

(56) References Cited

U.S. PATENT DOCUMENTS

| 5,416,663 | A  | * | 5/1995  | Atkins ................... H04M 1/745 361/111 |
| 5,969,929 | A  |   | 10/1999 | Kleveland et al. |
| 7,151,298 | B1 | * | 12/2006 | Eggert .................... H01L 23/60 257/355 |
| 7,564,663 | B2 | * | 7/2009  | Nicholson .............. H02H 9/046 327/309 |
| 7,589,944 | B2 |   | 9/2009  | Mergens et al. |
| 7,609,495 | B2 |   | 10/2009 | Soldner et al. |
| 7,989,987 | B2 | * | 8/2011  | McDonald ............... H03K 3/57 307/106 |
| 9,019,669 | B1 | * | 4/2015  | Ransijn .................. H02H 9/046 361/56 |
| 2005/0162790 | A1 | * | 7/2005 | Yoshinaga .......... H01L 27/0251 361/56 |
| 2009/0046401 | A1 | * | 2/2009 | Dunnihoo .............. H02H 9/042 361/56 |
| 2011/0181990 | A1 | * | 7/2011 | Huang ................... H02H 9/046 361/56 |

(Continued)

FOREIGN PATENT DOCUMENTS

| JP | 2000510653 A | 8/2000 |
| WO | 2008015213 A1 | 2/2008 |

OTHER PUBLICATIONS

Banerjee, K., et al., Analysis and Design of Distributed ESD Protection Circuits for Highspeed Mixed-Signal and RFICs; Electron Devices, IEEE Transactions, vol. 49, Issue 8; Aug. 2002: pp. 1444-1454, (3 pages).

(Continued)

*Primary Examiner* — Dharti Patel
(74) *Attorney, Agent, or Firm* — Cantor Colburn LLP; Daniel Morris (57) ABSTRACT

A distributed electrostatic discharge protection circuit includes a plurality of electrostatic discharge protection elements and a current balancing network connecting the plurality of electrostatic discharge protection elements. The current balancing network is configured in a return path of the distributed electrostatic discharge protection circuit such that during an electrostatic discharge (ESD) event, the circuit provides predefined current density within each of the electrostatic discharge protection elements.

20 Claims, 6 Drawing Sheets

(56) References Cited

U.S. PATENT DOCUMENTS

2012/0275074 A1* 11/2012 Dill .................... H02H 9/046
361/56
2013/0163127 A1* 6/2013 Chu .................... H02H 9/046
361/56

OTHER PUBLICATIONS

Ker, Ming-Dou, et al., "Decrasing-Size Distributed EDS Protection Scheme for Broad-Band RF Circuits," IEEE Transactions on Microwave Theory and Techniques, vol. 53, No. 2, Feb. 2005; pp. 582-589, (8 pages).

Ker, Ming-Dou, et al., "ESD Protection Design for Broadband RF Circuits with Decreaing-Size Distributed Protection Scheme", 2004, IEEE Radio Frequency Integrated Circuits Symposium; pp. 383-386, (4 pages).

Kleveland, Bendik et al., "Distributed ESD Protection for High-Speed Integrated Circuits," IEEE Electron Device Letters, vol. 21, No. 8, Aug. 2000; pp. 390-392, (3 pages).

* cited by examiner

DISTRIBUTED ELECTROSTATIC DISCHARGE PROTECTION CIRCUIT WITH MAGNETICALLY COUPLED DIFFERENTIAL INPUTS AND OUTPUTS

BACKGROUND

The present disclosure relates to electrostatic discharge protection, and more specifically, to electrostatic discharge protection circuits with magnetically coupled differential inputs and outputs.

The input and output speed of integrated circuits (ICs) constantly increases with each respective new generation of chips. Input/output (I/O) pins of large ICs can exceed 4 Tb of data per second of aggregated data transfer. ICs tend to build up electrostatic charges. Consequently, ICs are routinely configured with electrostatic discharge (ESD) protection circuits to mitigate chip damage caused by electrostatic charge buildup. However, at higher data transfer rates, capacitance of ESD protection elements may exceed allowable limits. Unfortunately, ESD devices have not scaled to keep up with increases in IC speed. In some conventional approaches, T-coils have been used to cancel out a portion of the capacitance. However, this may not be sufficient for ultra-wide band ICs.

SUMMARY

According to some embodiments, a distributed electrostatic discharge protection circuit includes a plurality of electrostatic discharge protection elements and a current balancing network connecting the plurality of electrostatic discharge protection elements. The current balancing network is configured in a return path of the distributed electrostatic discharge protection circuit such that during an electrostatic discharge (ESD) event, the circuit provides predefined current density within each of the electrostatic discharge protection elements.

According to other embodiments, a method for electrostatic discharge protection may include configuring a plurality of electrostatic discharge protection elements in a current balancing network having a plurality of electrostatic discharge protection elements, and grounding the electrostatic discharge protection elements via a return path of a distributed electrostatic discharge protection circuit such that during an electrostatic discharge (ESD) event the circuit provides predefined current density within each of the electrostatic discharge protection elements.

According to yet other embodiments, an apparatus may include a distributed electrostatic discharge protection circuit. The circuit may include a plurality of electrostatic discharge protection elements, and a current balancing network connecting the plurality of electrostatic discharge protection elements. The current balancing network is configured in a return path of the distributed electrostatic discharge protection circuit such that during an electrostatic discharge (ESD) event the circuit provides predefined current density within each of the electrostatic discharge protection elements.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
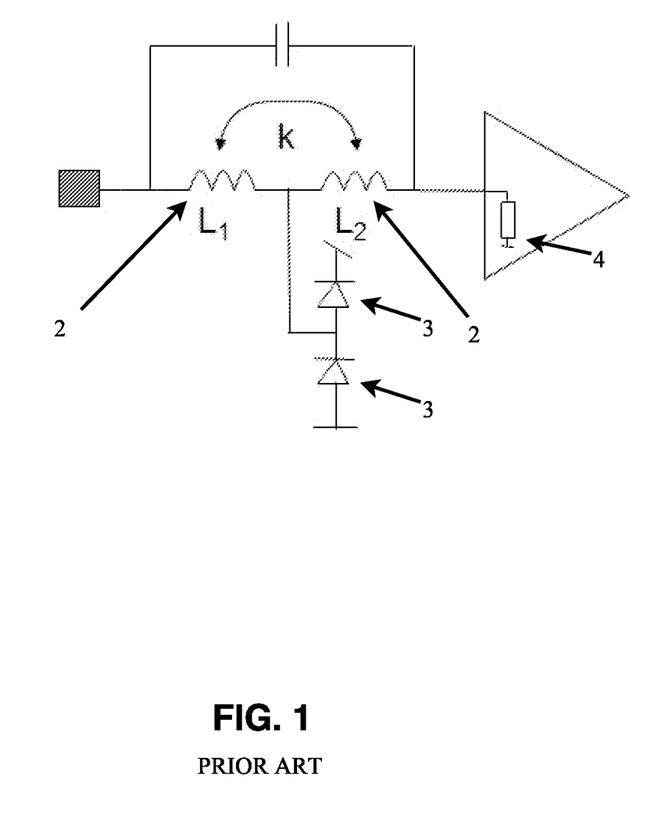
FIG. 1 illustrates a circuit diagram of a T-coil known in the art.

FIG. 1 illustrates a circuit diagram of a conventional T-coil circuit. As previously discussed, ESD devices have not scaled to keep up with increases in IC speeds of newer manufacturing technologies. In some conventional approaches, T-coils have been used to cancel out a portion of the capacitance. However, this may not be sufficient for ultra-wide band ICs. Conventional T-coil circuits (e.g., T-coil circuit depicted in FIG. 1) may include two magnetically coupled coils 2, which may be configured to tune out ESD-diode capacitance over a wide frequency range. In some conventional applications, conventional T-coil circuits may include two or more ESD diodes 3 that may be connected at the center tap of each magnetically coupled coil 2. Accordingly, magnetically coupled coils 2 may help protect the termination 4 from some (but not all) ESD damage. However, at higher data transfer rates, conventional T-coils ESD protection may become less effective for device capacitance mitigation. In some instances, the frequency range for the circuit may be extended but may not work as well if termination 4 has a moderately high capacitive component.

Figure 2:
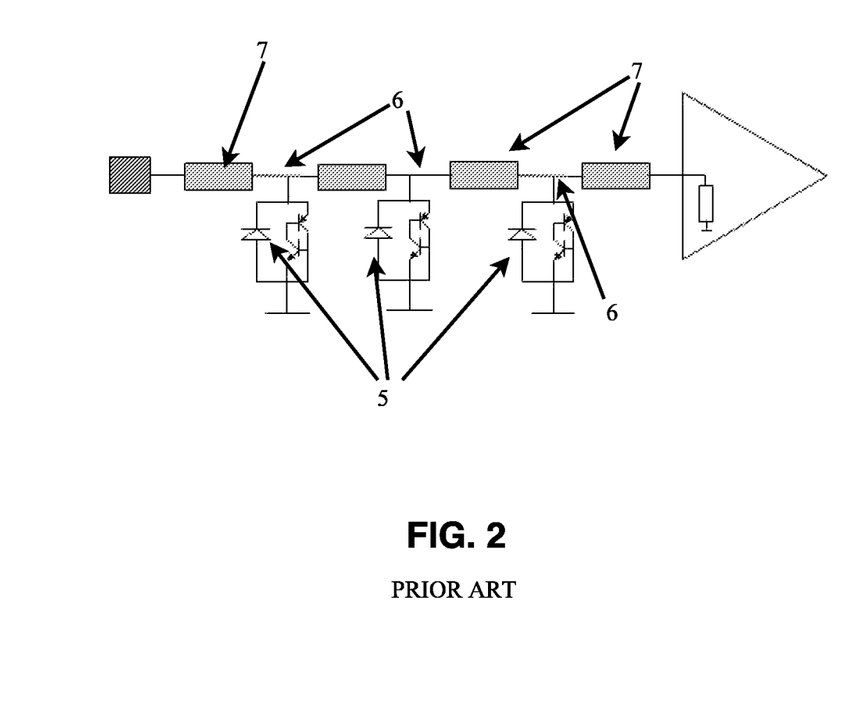
FIG. 2 depicts a conventional distributed electrostatic discharge protection circuit known in the art.

Other conventional approaches may include the use of distributed ESD protection circuits such as the circuit depicted with respect to FIG. 2. Many ESD protection circuits may include a plurality of diodes 5, which may be distributed across transmission lines 6. In conventional distributed ESD circuits, the on-chip transmission lines 6 may experience transmission loss that may be large for higher transmission rate applications.

Other approaches have attempted to distribute current through stacked diodes and resistors. However the signal loss of the stacked resistors has been shown to be less than optimal. For example, ESD circuits may be highly dependent on frequency, as current balance may lose effectiveness when used with more than one frequency, as shown in the example in FIG. 2.

In yet other conventional approaches, transmission lines 6 may be intervened by silicon controlled resistors (SCRs) 7 in an effort to balance current. In some configurations most ESD current may flow through SCR1, and significantly less through SCR2. Even less ESD current may flow through SCR3.

Figure 3:
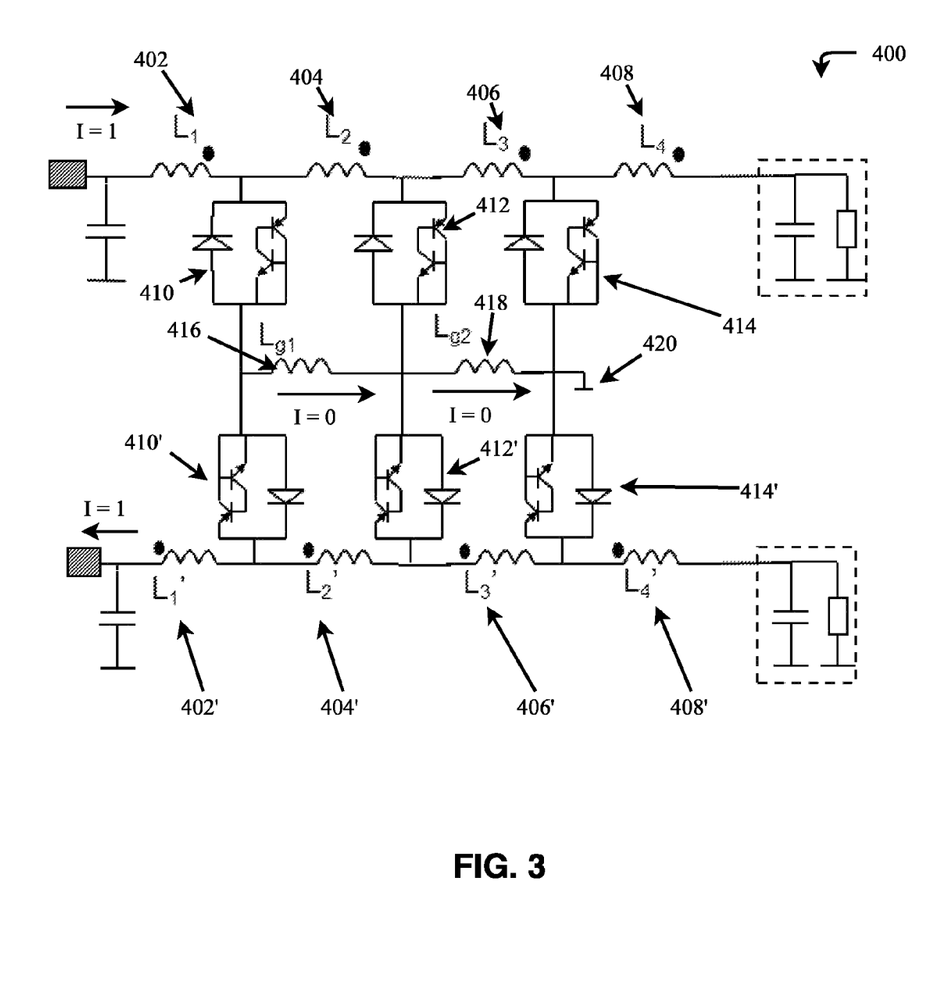
FIG. 3 depicts an electrostatic discharge current distribution differential input/output in accordance with an exemplary embodiment.

Referring now to FIG. 3, an electrostatic discharge current distribution network 400 (hereafter "current distribution network 400") is depicted, in accordance with an exemplary embodiment. As previously discussed, high speed I/Os are often differential in nature. Accordingly, in some aspects, it may be advantageous to introduce magnetic couplings to exploit the differential nature of the circuit. Referring now to FIG. 3, current distribution network 400 may include a plurality of magnetic couplings $L_1$ and $L_1'$, $L_2$ and $L_2'$, $L_3$ and $L_3'$, and $L_4$ and $L_4'$ (depicted as couplings 402/402', 404/404', 406/406', and 408/408', respectively). Couplings 402 and 402' may be comprised of a pair of coils magnetically coupled to one another. Similarly, coupling 404 may be coupled with 404', 406 with 406', and 408 may be coupled with 408', which may also be coil pairs.

Accordingly, couplings 402-408 may be configured to balance the load on current distribution network 400. Network 400 may further include a plurality of SCRs 410, 412, 414, 410', 412', and 414', which may be intervened by inductor coils $L_{g1}$ and $L_{g2}$ (416 and 418, respectively), which balance ESD currents in the ESD protection elements. Accordingly, the inductors may be configured in at least one chain of inductors. The bottom side of inductors 416 and 418 are part of the ground return path for all SCRs. By adding couplings 402-408, the effective size of the current distribution network 400 may be reduced by a factor of 2.

In other aspects, an ESD protection circuit such as current distribution network 400 may be optimal because the magnetic couplings (e.g., couplings 402-408), may not have a bypass path for pulse energy to bypass the ESD elements (e.g., load configurations). In contrast, when magnetic couplings are configured as single T-coils as in FIG. 3, the pulse energy may bypass the ESD elements.

In other aspects, the inductors may be configured to form a Chebyshev low-pass filter.

Figure 4:
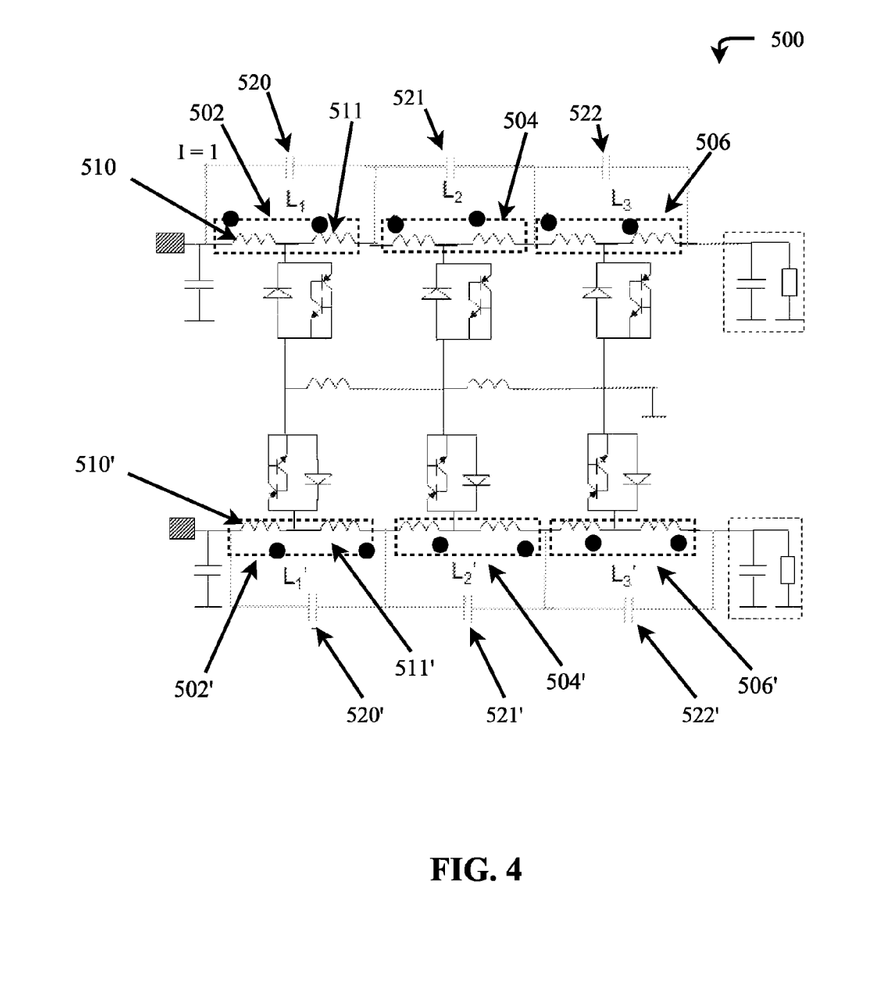
FIG. 4 depicts an electrostatic discharge current distribution differential input/output with coupled micro T-coils in accordance with an exemplary embodiment.

FIG. 4 depicts an electrostatic discharge current distribution differential input/output with coupled micro T-coils 500 (hereafter "network 500"), in accordance with an exemplary embodiment. As shown in FIG. 4, it may be advantageous to place a small differential T-coil on each ESD element along with a coupled capacitor, where the t-coil is magnetically coupled to the corresponding T-coil on the complimentary signal path. The following T-coil pairs may be magnetically coupled (502/502', 504/504', 506/506', 510/510', etc.). Network 500 may further include a plurality of bridge capacitors 520/520', 521/521', and 520/522', as designed in conventional T-coil configurations. The T-coil pairs may couple in a direction shown by a dot at a respective end of each T-coil. Accordingly, the magnetic couplings may transfer part of the ESD pulse to complementary inputs, which may allow some reduction in SCR (diode) size. In some aspects this configuration may results in a capacitance reduction, and increased bandwidth throughput.

Figure 5:
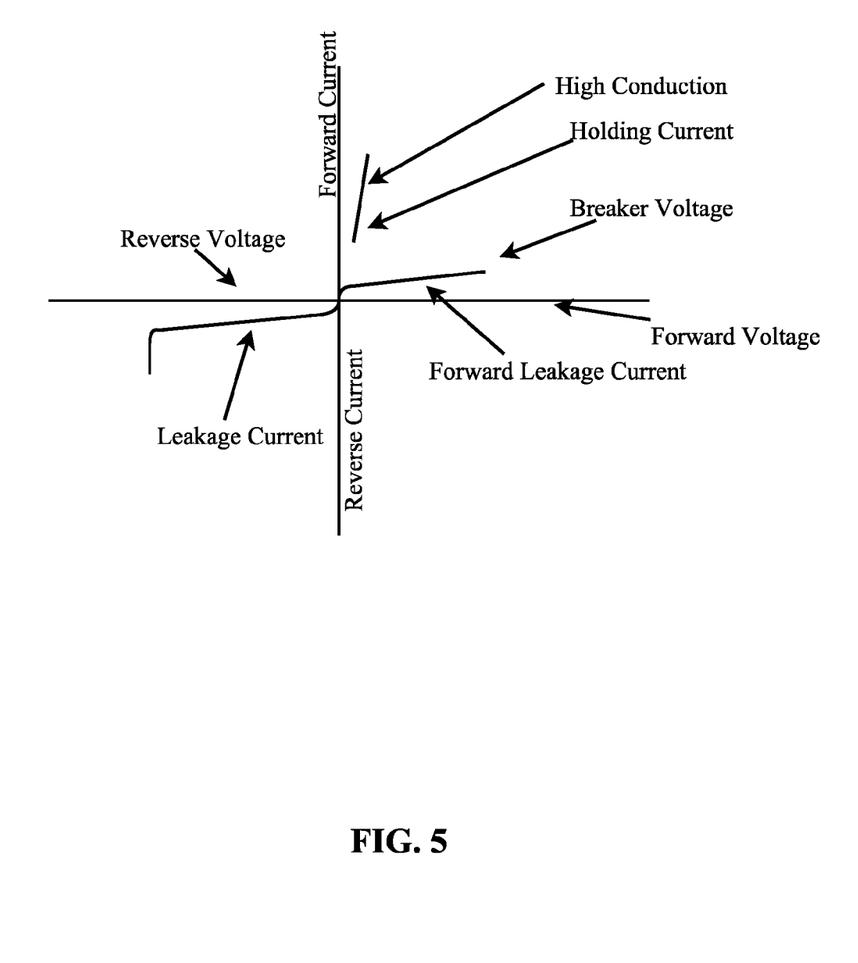
FIG. 5 depicts a graph of current/voltage characteristics of SCRs in accordance with an exemplary embodiment.

Central triggering for the SCR feature may be highly beneficial in some embodiments because the snapback in SCR current/voltage characteristic could prevent all other SCRs from triggering if one of the SCRs triggers early. This may be due in part to voltage decreases below triggering. In some aspects, triggering could be implemented similar to a SCR power clamp. Accordingly, trigger voltage may be sensed not only on the voltage supply, but also on the signal pin. FIG. 5 depicts a current/voltage characteristic plot for SCRs, according to some exemplary embodiments. Central triggering for the SCR feature is shown with respect to the snapback in an SCR IV-characteristic. In some embodiments, central triggering could prevent all other SCRs from triggering if one triggers early, since the voltage decreases below triggering.

Figure 6:
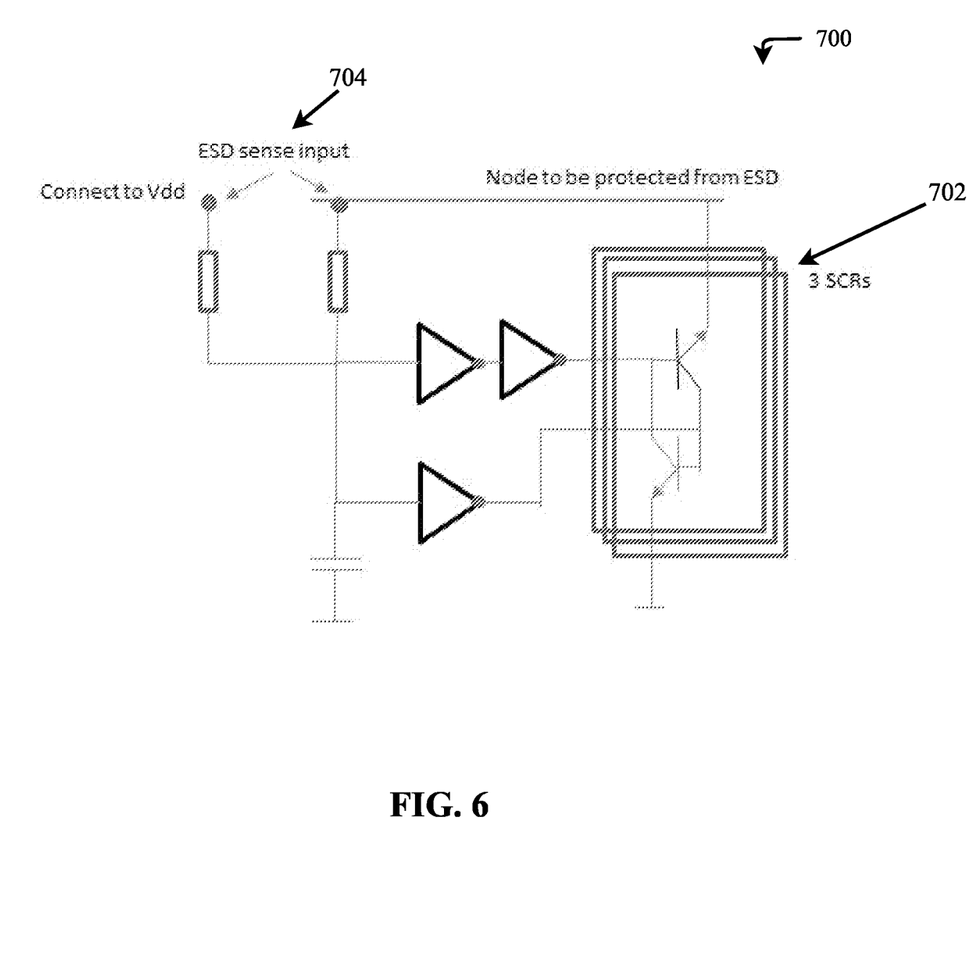
FIG. 6 depicts a centralized trigger circuit in accordance with some embodiments.

In some aspects, centralized triggering can be made by replacing a diode triggered SCR by a FET triggered SCR. Accordingly, the trigger circuit may detect a short pulse, similar to a clamp. FIG. 6 depicts a centralized trigger circuit 700, in accordance with some embodiments. According to some embodiments, centralized trigger circuit 700 may include a plurality of SCRs 702 in connection with the node to be protected from ESD. Accordingly, trigger circuit 700 can detect, at ESD sense input points 704, a short pulse beyond the ESD detection threshold.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A distributed electrostatic discharge protection circuit comprising:
    a plurality of electrostatic discharge protection elements;
    a current balancing network connecting the plurality of electrostatic discharge protection elements, wherein the current balancing network is configured in a return path of the distributed electrostatic discharge protection circuit such that during an electrostatic discharge (ESD) event, the circuit provides predefined current density within each of the electrostatic discharge protection elements; and
    a second chain of inductors magnetically coupled to a third chain of inductors.

2. The distributed electrostatic discharge protection circuit of claim 1, further comprising a first chain of inductors,
    wherein the first chain of inductors is inserted between a ground terminal of the electrostatic discharge protection elements such that a voltage drops across each of the electrostatic discharge protection elements;
    wherein the voltage is equal with respect to each of the electrostatic discharge protection elements; and
    wherein a current is provided to each of the electrostatic discharge protection elements.

3. The distributed electrostatic discharge protection circuit of claim 2, wherein the circuit is configured for differential input and differential output, and each inductor in the second chain of inductors forms a magnetically coupled coil pair with a corresponding inductor in the third chain of inductors.

4. The distributed electrostatic discharge protection circuit of claim 3, wherein the second chain of inductors and the third chain of inductors are sized to form a Chebyshev low-pass filter.

5. The distributed electrostatic discharge protection circuit of claim 3, wherein the second chain of inductors and the third chain of inductors comprise a plurality of magnetically coupled T-coil pairs.

6. The distributed electrostatic discharge protection circuit of claim 5, wherein the magnetically coupled T-coils pairs are coupled mutually between two differential signal paths, and wherein an electrostatic discharge protection element of the plurality of electrostatic discharge protection elements is connected between a center-tap of the T-coils and the return path.

7. The distributed electrostatic discharge protection circuit of claim 1, wherein the circuit includes a distributed topology comprising a centralized triggering circuit for triggering the electrostatic discharge protection elements, wherein the centralized triggering circuit is configured to simultaneously trigger all electrostatic discharge protection elements in the circuit.

8. A method for electrostatic discharge protection in an electrostatic discharge protection circuit comprising:

configuring a plurality of electrostatic discharge protection elements in a current balancing network having a plurality of electrostatic discharge protection elements;

grounding the electrostatic discharge protection elements via a return path of a distributed electrostatic discharge protection circuit such that during an electrostatic discharge (ESD) event the circuit provides predefined current density within each of the electrostatic discharge protection elements; and configuring the electrostatic discharge protection circuit for differential input and differential output by magnetically coupling a second chain of inductors to a third chain of inductors.

9. The method of claim 8, further comprising configuring the distributed electrostatic discharge protection circuit with a first chain of inductors;

inserting the first chain of inductors between a ground terminal of the electrostatic discharge protection elements such that a voltage drops across each of the electrostatic discharge protection elements, wherein the voltage is equal with respect to each of the electrostatic discharge protection elements; and providing a current to each of the electrostatic discharge protection elements.

10. The method of claim 9, wherein each inductor in the second chain of inductors forms a magnetically coupled coil pair with a corresponding inductor in a third chain of inductors.

11. The method of claim 10, wherein the second chain of inductors and the third chain of inductors are sized to form a Chebyshev low-pass filter.

12. The method of claim 10, wherein the second chain of inductors and the third chain of inductors comprise a plurality of magnetically coupled T-coil pairs.

13. The method of claim 12, wherein the magnetically coupled T-coils pairs are coupled mutually between two differential signal paths, and wherein an electrostatic discharge protection element of the plurality of electrostatic discharge protection elements is connected between a center-tap of the T-coils and the return path.

14. The method of claim 8, further comprising configuring the circuit with a centralized triggering circuit for triggering the electrostatic discharge protection elements, and simultaneously trigger all electrostatic discharge protection elements in the circuit via the centralized triggering circuit.

15. An apparatus comprising a distributed electrostatic discharge protection circuit comprising:

a plurality of electrostatic discharge protection elements;

a current balancing network connecting the plurality of electrostatic discharge protection elements, wherein the current balancing network is configured in a return path of the distributed electrostatic discharge protection circuit such that during an electrostatic discharge (ESD) event the circuit provides predefined current density within each of the electrostatic discharge protection elements; and a second chain of inductors magnetically coupled to a third chain of inductors.

16. The apparatus of claim 15, further comprising a first chain of inductors, wherein the first chain of inductors is inserted between a ground terminal of the electrostatic discharge protection elements such that a voltage drops across each of the electrostatic discharge protection elements, wherein the voltage is equal with respect to each of the electrostatic discharge protection elements, and wherein a current is provided to each of the electrostatic discharge protection elements.

17. The apparatus of claim 16, wherein the circuit is configured for differential input and differential output, and each inductor in the second chain of inductors forms a magnetically coupled coil pair with a corresponding inductor in the third chain of inductors.

18. The apparatus of claim 17, wherein the second chain of inductors and the third chain of inductors are sized to form a Chebyshev low-pass filter.

19. The apparatus of claim 17, wherein the second chain of inductors and the third chain of inductors comprise a plurality of magnetically coupled T-coil pairs.

20. The apparatus of claim 19, wherein the magnetically coupled T-coils pairs are coupled mutually between two differential signal paths, and wherein an electrostatic discharge protection element of the plurality of electrostatic discharge protection elements is connected between a center-tap of the T-coils and the return path.

* * * * *